(12) United States Patent  (10) Patent No.: US 9,013,939 B2
Yamagami  (45) Date of Patent: Apr. 21, 2015

(54) SEMICONDUCTOR MEMORY DEVICE

(71) Applicant: Panasonic Corporation, Osaka (JP)

(72) Inventor: Yoshinobu Yamagami, Osaka (JP)

(73) Assignee: Socionext Inc., Kanagawa (JP)

(*) Notice: Subject to any disclaimer, the term of this patent is extended or adjusted under 35 U.S.C. 154(b) by 247 days.

(21) Appl. No.: 13/687,869

(22) Filed: Nov. 28, 2012

(65) Prior Publication Data

US 2013/0088932 A1 Apr. 11, 2013

Related U.S. Application Data

(63) Continuation of application No. PCT/JP2012/000333, filed on Jan. 20, 2012.

(30) Foreign Application Priority Data

Jan. 20, 2011 (JP) ................. 2011-009589

(51) Int. Cl.
G11C 7/00 (2006.01)
G11C 5/14 (2006.01)
G11C 7/12 (2006.01)
G11C 8/08 (2006.01)
G11C 11/417 (2006.01)

(52) U.S. Cl.
CPC .. G11C 5/14 (2013.01); G11C 7/12 (2013.01); G11C 8/08 (2013.01); G11C 11/417 (2013.01)

(58) Field of Classification Search
USPC ..................... 365/203, 207, 230.06
See application file for complete search history.

(56) References Cited

U.S. PATENT DOCUMENTS

| 5,384,734 | A | * | 1/1995 | Tsujihashi et al. ....... 365/189.04 |
| 5,408,144 | A | | 4/1995 | Sakata et al. |
| 5,969,995 | A | | 10/1999 | Morishima |
| 6,031,778 | A | | 2/2000 | Makino et al. |
| 6,188,628 | B1 | | 2/2001 | Tomotani |
| 6,333,874 | B2 | | 12/2001 | Yamauchi |
| 6,956,789 | B2 | * | 10/2005 | Agrawal et al. ............ 365/233.5 |
| 7,433,257 | B2 | * | 10/2008 | Yamagami ................... 365/226 |
| 7,692,978 | B2 | * | 4/2010 | Takahashi et al. ....... 365/189.09 |
| 2001/0028591 | A1 | | 10/2001 | Yamauchi |
| 2002/0027256 | A1 | | 3/2002 | Ishibashi et al. |
| 2003/0076705 | A1 | | 4/2003 | Yamaoka et al. |

FOREIGN PATENT DOCUMENTS

JP 58-211391 A 12/1983
JP 61-115295 A 6/1986

(Continued)

OTHER PUBLICATIONS

International Search Report mailed Apr. 24, 2012 issued in corresponding International Application No. PCT/JP2012/000333.

Primary Examiner — Pho M Luu
(74) Attorney, Agent, or Firm — McDermott Will & Emery LLP

(57) ABSTRACT

A semiconductor memory device includes a memory cell connected to a word line and a bit line, for storing and holding data, a word line driver circuit connected to the word line, a bit line precharge circuit connected to the bit line, and a peripheral control circuit. First power supply VDD is connected to the memory cell and the peripheral control circuit, and first power supply VDD is connected to word line driver circuit and bit line precharge circuit through switching element controlled by first control signal PD.

18 Claims, 9 Drawing Sheets

(56) References Cited

FOREIGN PATENT DOCUMENTS

| JP | 06-203558 A | 7/1994 |
| JP | 10-261946 A | 9/1998 |
| JP | 11-219589 A | 8/1999 |
| JP | 2000-298987 A | 10/2000 |
| JP | 2001-015704 A | 1/2001 |
| JP | 2001-344979 A | 12/2001 |
| JP | 2003-132683 A | 5/2003 |
| JP | 2005-032404 A | 2/2005 |

* cited by examiner

SEMICONDUCTOR MEMORY DEVICE

RELATED APPLICATIONS

This application is a Continuation of International Application No. PCT/JP2012/000333, filed on Jan. 20, 2012, which in turn claims the benefit of Japanese Application No. 2011-009589, filed on Jan. 20, 2011, the disclosures of which Applications are incorporated by reference herein.

BACKGROUND

1. Technical Field

The present invention relates to a semiconductor memory device provided with a memory cell for storing and holding data. More particularly, the present invention relates to a technique to lower power consumption of a semiconductor memory device by cutting off a power supply to a specific circuit in the semiconductor memory device.

2. Background Art

Recently, a semiconductor process has been increasingly refined, which causes problems that a leakage current is increased in a transistor in a semiconductor memory device and power consumption is increased.

PTL 1 discloses a method for lowering power consumption while maintaining data stored in a memory cell when a semiconductor memory device is in a standby state. According to PTL 1, a leakage current is reduced and the power consumption is lowered by cutting off all power supplies to peripheral circuits while continuing a power supply to the memory cell. However, according to PTL 1, since all of the power supplies to the peripheral circuits are cut off, a word line is put into a floating state. Therefore, due to an influence of a switching noise of a power supply switch for cutting off the power supply to the peripheral circuit, there is a variation in potential of the word line in the floating state, and as a result, the problem is that the data stored in the memory cell could be destroyed.

PTL 2 proposes a configuration to solve the problem of PTL 1, in which a word line switch is added to fix a word line to a low impedance while power supplies to peripheral circuits are cut off.

In addition, PTL 3 discloses another method for lowering power consumption while a semiconductor memory device is in a standby mode. According to PTL 3, while the semiconductor memory device is in the standby mode (a frequency of accesses to a memory cell is 10% or less of a frequency in a normal mode), a bit line precharge circuit for precharging a bit line is controlled so that the bit line is put into the floating state, whereby a leakage current of the bit line precharge circuit can be reduced, and the power consumption can be lowered.

CITATION LIST

Patent Literatures

PTL 1: Unexamined Japanese Patent Publication No. S61-115295

PTL 2: Unexamined Japanese Patent Publication No. 2000-298987 (FIG. 1 etc.)

PTL 3: Unexamined Japanese Patent Publication No. 2001-344979 (paragraph [0070], FIG. 1, etc.)

SUMMARY

According to the techniques in PTL 1 and PTL 2, while the semiconductor memory device is in the standby state, all of the peripheral circuits except for the memory cell are cut off from the power supplies, so that a predetermined time (power supply recovery time) is needed for the semiconductor memory device to transfer from the standby state (in which peripheral circuit is cut off from the power supply) to a normal acting state (in which data can be read and written).

The power supply recovery time of the semiconductor memory device can be shortened by enhancing a driving ability of a power supply cutoff switching element in the peripheral circuit and reducing an impedance. Here, the power supply cutoff switching element is composed of a transistor in general, so that the driving ability of the transistor is enhanced and the impedance is reduced by increasing a channel width of the transistor. However, when the channel width is increased, the problem is that an area of the semiconductor memory device is increased.

In addition, when the driving ability of the power supply cutoff switching element is low, and the impedance is high, a voltage drop becomes large. When the voltage drop is large, a voltage which is supplied to the peripheral circuit through the power supply cutoff switching element is reduced at the time of the normal action, which deteriorates performance of the peripheral circuit, so that desired performance cannot be provided in the semiconductor memory device. In order to solve this problem, similar to the case to shorten the power supply recovery time, it is necessary to enhance the driving ability of the power supply cutoff switching element (transistor) and reduce the impedance, and it is necessary to increase the channel width of the transistor. However, when the channel width is increased, the area of the semiconductor memory device is increased as described above.

Thus, according to PTLs 1 and 2, the power supplies to all of the peripheral circuits are cut off while the semiconductor memory device is in the standby state, so that the power consumption can be effectively lowered, but it becomes necessary to increase the channel width of the switching element in order to shorten the power supply recovery time of the semiconductor memory device and ensure the performance of the peripheral circuit, which causes the problem that there is a considerable increase in area of the semiconductor memory device.

Furthermore, according to the technique in PTL 2, the word line switch to fix the word line to the low impedance is added to each word line, so that the problem is that the area of the semiconductor memory device is further increased.

In addition, according to the technique in PTL 3, the leakage current of the bit line precharge circuit can be reduced, but the leakage current of the semiconductor memory device except for the leakage current of the memory cell transistor is not sufficiently reduced, compared with the case where the leakage currents of the whole peripheral circuits are reduced like the techniques in PTLs 1 and 2.

The present invention has been made in view of the above points, and an object thereof is to provide a semiconductor memory device in which a power supply recovery time of the semiconductor memory device is shortened, and performance of a peripheral circuit is ensured without considerably increasing an area of the semiconductor memory device like PTLs 1 and 2, and a leakage current is more efficiently reduced in the semiconductor memory device than the technique of PTL 3.

In addition, according to the present invention, while the semiconductor memory device is in the standby state, a word line is fixed to a low impedance to prevent data stored in a memory cell from being destroyed without adding the word line switch to fix the word line to the low impedance like PTL 2.

That is, in general, the leakage current of the transistor is increased in proportion to the channel width of the transistor. The leakage current in the semiconductor memory device is increased in proportion to a total value of the channel widths of the transistors.

The performance of the semiconductor memory device is determined by a driving time of the word line, a precharging time of the bit line, and the like. Thus, in order to enhance the performance of the semiconductor memory device, a word line driver circuit for driving the word line or the bit line precharge circuit for precharging the bit line needs to drive a load at high speed. Therefore, a channel width of the transistor in the word line driver circuit or the bit line precharge circuit is designed to be large in order to enhance the driving ability. In addition, the word line driver circuit and the bit line precharge circuit are needed for each word line and each bit line, respectively. Thus, the word line driver circuit and the bit line precharge circuit account for a majority of a total value of the channel widths of the transistors in the circuits except for the memory cell transistor in the semiconductor memory device. Therefore, the leakage currents of both of the word line driver circuit and the bit line precharge circuit account for the majority of the leakage current of the semiconductor memory device. For example, according to an examination by the inventor, in a case of 1-port SRAM with 16 kbits (128 word lines×128 bit lines) in a CMOS process, the leakage currents of both of the word line driver circuit and the bit line precharge circuit account for about 50% of the total value (except for the leakage current of the memory cell transistor). In addition, in a case of 1-port SRAM with 64 kbits (256 word lines×256 bit lines), the leakage currents of both of the word line driver circuit and the bit line precharge circuit account for about 70% of the total value (except for the leakage current of the memory cell transistor). Thus, it is found that leakage currents of both of the word line driver circuit and the bit line precharge circuit account for the majority of the leakage current of the semiconductor memory device except for the leakage current of the memory cell transistor.

Therefore, it is found that by only cutting off the power supplies to both of the word line driver circuit and the bit line precharge circuit instead of cutting off the whole peripheral circuits while the semiconductor memory device is in the standby state, most of the leakage current can be reduced and the power consumption can be effectively lowered, and compared with the case where the power supplies to all of the peripheral circuits are cut off, the channel width (driving ability) of the switching element for cutting off the power supply to each of the word line driver circuit and the bit line precharge circuit can be set small, so that the area of the semiconductor memory device can be effectively prevented from increasing.

Furthermore, in the case of the technique in PTL 3, the leakage current of the bit line precharge circuit is reduced, but the leakage current of the word line driver circuit is not reduced, so that it is found that the leakage current of the semiconductor memory device except for the leakage current of the memory cell transistor is not sufficiently reduced.

In view of the above, according to one aspect of the present invention, a semiconductor memory device includes at least one memory cell connected to a word line and a bit line, for storing and holding data, at least one word line driver circuit connected to the word line, at least one bit line precharge circuit connected to the bit line, and a peripheral control circuit, in which a first power supply is connected to the memory cell and the peripheral control circuit, and the first power supply is connected to the word line driver circuit and the bit line precharge circuit through a switching element controlled by a first control signal.

According to one aspect of the present invention, a semiconductor memory device includes at least one memory cell connected to a word line and a bit line, for storing and holding data, at least one word line driver circuit connected to the word line, at least one bit line precharge circuit connected to the bit line, and a peripheral control circuit, in which a first power supply is connected to the memory cell, the peripheral control circuit, and the bit line precharge circuit, the first power supply is connected to the word line driver circuit through a switching element controlled by a first control signal, and a control signal based on the first control signal is inputted to the bit line precharge circuit, so that the bit line precharge circuit is controlled to be turned off when the switching element is turned off.

According to the semiconductor memory device in the one aspect of the present invention, the switching element includes a MOS transistor, and the MOS transistor is turned on or off by the first control signal.

According to the semiconductor memory device in the one aspect of the present invention, the MOS transistor in the switching element has at least one of following two configurations.

(1) a transistor length of the MOS transistor in the switching element is larger than a transistor length of a MOS transistor in the word line driver circuit. (2) a gate oxide film thickness of the MOS transistor in the switching element is larger than a gate oxide film thickness of the MOS transistor in the word line driver circuit. The MOS transistor may have both of the two configurations as a matter of course.

According to the semiconductor memory device in the one aspect of the present invention, the switching elements are distributed in at least two positions in the peripheral control circuit.

According to the semiconductor memory device in the one aspect of the present invention, the switching elements are distributed in at least two positions in a periphery of the plurality of word line driver circuits.

According to the semiconductor memory device in the one aspect of the present invention, the switching elements are distributed in at least two positions in a periphery of the plurality of bit line precharge circuits.

According to the semiconductor memory device in the one aspect of the present invention, the switching element is arranged adjacent to a substrate power supply region of the memory cell.

According to the one aspect of the present invention, the semiconductor memory device has a first substrate power supply of a plurality of P-type MOS transistors in the memory cell, and a second substrate power supply of a plurality of N-type MOS transistors in the memory cell. In addition, the semiconductor memory device has at least one of (1) a voltage equal to or higher than source power supplies of the plurality of P-type MOS transistors in the memory cell is supplied to the first substrate power supply, and (2) a voltage equal to or lower than source power supplies of the plurality of N-type MOS transistors in the memory cell is supplied to the second substrate power supply.

According to the semiconductor memory device in the one aspect of the present invention, when the switching element is in an off state, the first power supply connected to the memory cell is controlled to be equal or lower than a voltage provided while the switching element is in an on state.

According to these aspects of the present invention, while the semiconductor memory device is in the standby state, the switching element cuts off the power supply from the first power supply to the word line driver circuit and the bit line precharge circuit which account for the majority of the leakage current, so that the leakage current can be effectively reduced in the semiconductor memory device. In addition, the load of the switching element is reduced compared with the case where the power supplies to all of the peripheral circuits are cut off, so that its channel width can be effectively reduced, and as a result, the area of the semiconductor memory device can be prevented from being increased.

According to one aspect of the present invention, a semiconductor memory device includes at least one memory cell connected to a word line and a bit line, for storing and holding data, at least one word line driver circuit connected to the word line, and a peripheral control circuit, in which a first power supply is connected to the memory cell and the peripheral control circuit, and the first power supply is connected to the word line driver circuit through a switching element controlled by a first control signal.

According to this aspect, while the semiconductor memory device is in the standby state, the switching element cuts off the power supply from the first power supply to at least the word line driver circuit, so that the leakage current can be effectively reduced in the semiconductor memory device. In addition, since the power supply to the peripheral control circuit is continued, a word line control signal inputted to the word line driver circuit is maintained at H level, and the word line is fixed to L level. Therefore, data stored in the memory cell can be surely maintained without adding the word line switch for fixing the word line to the low impedance.

As described above, according to one of the above aspects, while the area is prevented from being increased, the leakage current at the time of standby state can be effectively reduced.

According to the other aspect, the data stored in the memory cell can be surely maintained at the time of the standby state without adding the word line switch for fixing the word line to the low impedance.

DESCRIPTION OF EMBODIMENTS

Hereinafter, exemplary embodiments of the present invention will be detailed with reference to the drawings. In addition, in the following embodiments, a component having the same function as that of another embodiment is marked with the same reference marks and its description is omitted.

First Exemplary Embodiment

Figure 1:
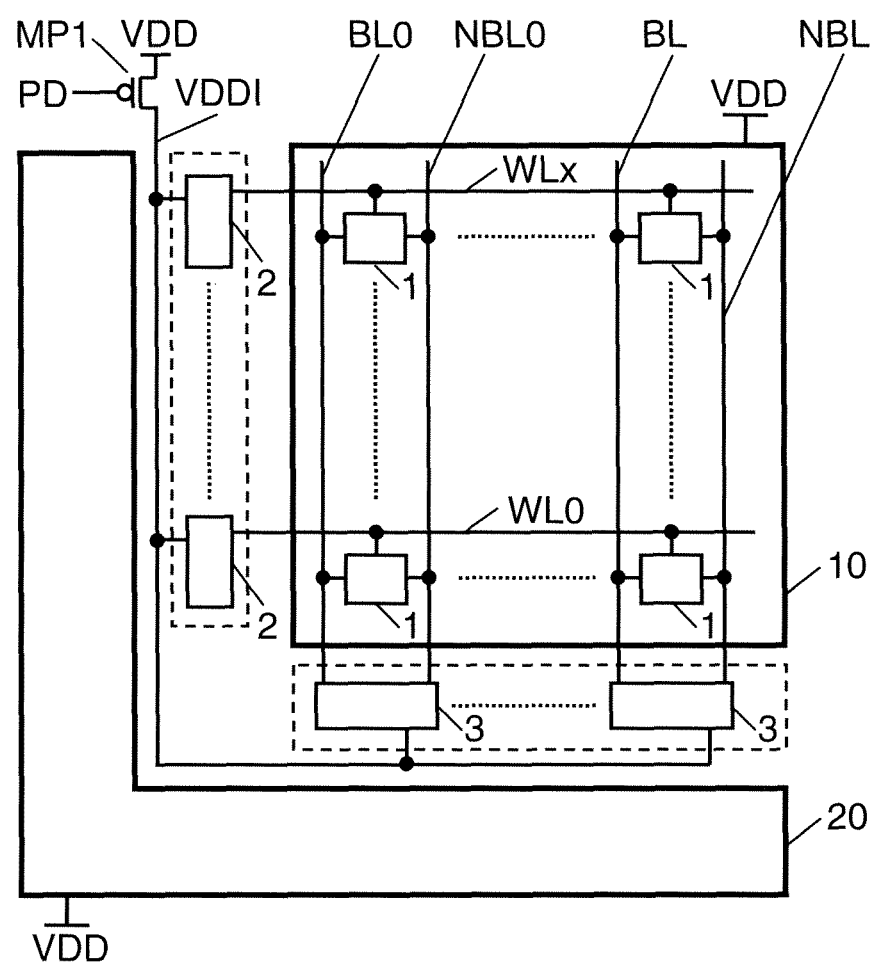
FIG. 1 is a circuit diagram showing a configuration of a semiconductor memory device in a first exemplary embodiment of the present invention.

FIG. 1 is a configuration diagram of a semiconductor memory device according to a first exemplary embodiment of the present invention.

The semiconductor memory device shown in FIG. 1 includes memory cell 1, word line driver circuit 2, bit line precharge circuit 3, P-type MOS transistor MP1, memory array 10, and peripheral control circuits 20. In addition, the semiconductor memory device includes word lines WL0 to WLx, and bit lines BL0 to BLy and NBL0 to NBLy. Power supply cutoff signal PD is inputted to a gate of P-type MOS transistor MP1. Power supply (first power supply) VDD is supplied to a source of P-type MOS transistor MP1 and memory array 10, and internal power supply VDDI is supplied to word line driver circuit 2 and bit line precharge circuit 3. In addition, x and y are each 1 or more integral number, which means there are a plurality of memory cells 1, word line driver circuits 2, and bit line precharge circuits 3 in FIG. 1. Memory array 10 shows a region in which the plurality of memory cells 1 are provided.

P-type MOS transistor MP1 functions as a power supply cutoff switching element, and the gate terminal is connected to power supply cutoff signal (first control signal) PD, the source terminal and a drain terminal are connected to power supply VDD and internal power supply VDDI, respectively.

Each of word lines WL0 to WLx connected to an output of each word line driver circuit 2 is connected to each memory cell 1. In addition, each of bit lines BL0 to BLy and NBL0 to NBLy connected to each memory cell 1 is connected to each bit line precharge circuit 3.

Figure 2:
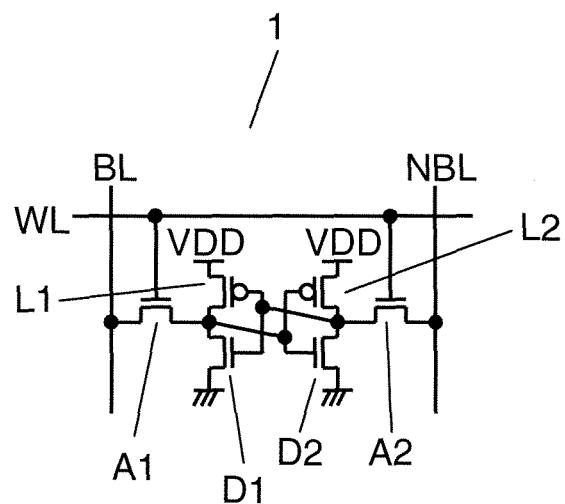
FIG. 2 is a circuit diagram showing a specific configuration of a memory cell provided in the semiconductor memory device.

FIG. 2 is a diagram showing a specific circuit configuration of memory cell 1 in FIG. 1.

Referring to FIG. 2, memory cell 1 includes access transistors A1 and A2, drive transistors D1 and D2, and load transistors L1 and L2. Memory cell 1 is connected to word line WL, bit lines BL and NBL, and power supply VDD.

Load transistor L1 and drive transistor D1, or load transistor L2 and drive transistor D2 compose an inverter, and a flip-flop is composed by connecting input and output terminals of the inverters. Data is stored in this flip-flop. In addition, gate terminals of access transistors A1 and A2 are connected to word line WL, and drain terminals thereof are connected to bit lines BL and NBL, respectively. In addition, source terminals of access transistors A1 and A2 are connected to the input and output terminals of the inverters, respectively.

Data is written in memory cell 1 by switching a potential of one of bit lines BL and NBL which have been previously precharged to H level, from H level to L level under a condition that word line WL has been switched from L level to H level (active state). Data is read from memory cell 1 by switching a potential of one of bit lines BL and NBL which have been previously precharged to H level, from H level to L level, by activating the word line WL, based on a state stored by the flip-flop in the memory cell.

In addition, when word line WL is at L level (inactivated state), access transistors A1 and A2 are both turned off, so that the data stored in the flip-flop is not externally affected, and the same data is stored and held therein as long as power supply VDD is supplied.

Figure 3:
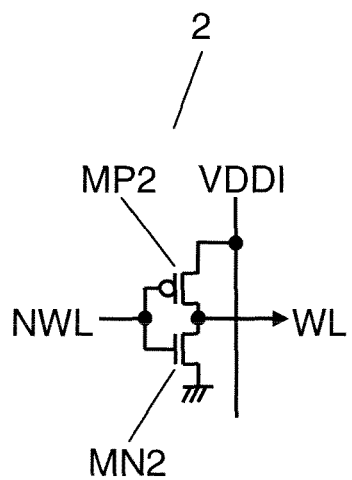
FIG. 3 is a circuit diagram showing a specific configuration of a word line driver circuit provided in the semiconductor memory device.

FIG. 3 is a diagram showing a specific circuit configuration of word line driver circuit 2 in FIG. 1.

Referring to FIG. 3, word line driver circuit 2 includes P-type MOS transistor MP2, and N-type MOS transistor MN2. Word line control signal NWL and internal power supply VDDI are inputted to word line driver circuit 2. Word line driver circuit 2 is connected to word line WL. P-type MOS transistor MP2 and N-type MOS transistor MN2 are connected in series, and word line control signal NWL is inputted to both gate terminals thereof. Internal power supply VDDI is applied to a source terminal of P-type MOS transistor MP2, and power supply VDD is connected thereto through the switching element (P-type MOS transistor MP1 in FIG. 1). Meanwhile, a source terminal of N-type MOS transistor MN2 is grounded. In addition, a connection point between P-type MOS transistor MP2 and N-type MOS transistor MN2 is connected to word line WL.

Thus, P-type MOS transistor MP2 and N-type MOS transistor MN2 compose an inverter, and an inversion signal of word line control signal NWL is outputted to word line WL.

While the semiconductor memory device is in an inactivated state, H level is applied to word line control signal NWL in each word line driver circuit 2, and each word line WL outputs L level (that is, each word line is in an unselected state).

Figure 4:
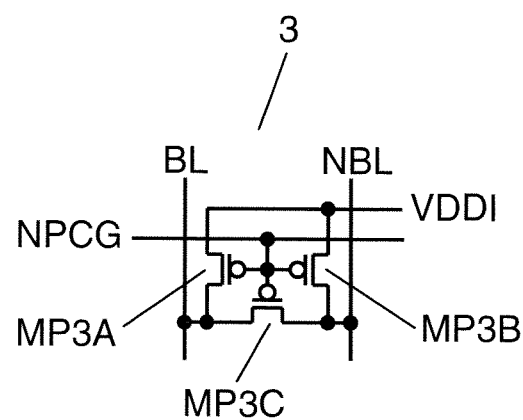
FIG. 4 is a circuit diagram showing a specific configuration of a bit line precharge circuit provided in the semiconductor memory device.

FIG. 4 is a diagram showing a specific circuit configuration of bit line precharge circuit 3 in FIG. 1.

Referring to FIG. 4, bit line precharge circuit 3 includes P-type MOS transistors MP3A to MP3C. Bit line precharge control signal NPCG and internal power supply VDDI are inputted to bit line precharge circuit 3. In addition, bit line precharge circuit 3 is connected to bit lines BL and NBL.

Gate terminals of P-type MOS transistor MP3A and P-type MOS transistor MP3B are connected to bit line precharge control signal NPCG, drain terminals thereof are connected to bit lines BL and NBL, respectively, and source terminals thereof is connected to internal power supply VDDI. A gate terminal of P-type MOS transistor MP3C is connected to bit line precharge control signal NPCG, and a drain terminal and a source terminal thereof are connected to bit lines BL and NBL, respectively.

Bit line precharge circuit 3 is controlled by bit line precharge control signal NPCG. While the semiconductor memory device is in the inactivated state (that is, while each word line is in the unselected state), bit line precharge control signal NPCG is at L level, and P-type MOS transistors MP3A to MP3C are on. Each of bit lines BL and NBL is precharged to H level to prepare for the next writing and reading actions of the data in the memory cell (the activated state of the semiconductor memory device).

Referring to FIG. 1, peripheral control circuits 20 include circuits such as an address decode circuit for controlling word line driver circuit 2, a control circuit for controlling bit line precharge circuit 3, and a circuit for controlling writing or reading of the data in memory cell 1, and peripheral control circuits 20 are circuits except for memory array 10, word line driver circuit 2, and bit line precharge circuit 3 in the semiconductor memory device in FIG. 1.

Power supply VDD is directly supplied to memory array 10 and peripheral control circuits 20, and each transistor in memory array 10 and peripheral control circuits 20 is driven by power supply VDD. Internal power supply VDDI is supplied from power supply VDD to word line driver circuit 2 and bit line precharge circuit 3 through the P-type MOS transistor MP1 controlled by power supply cutoff signal PD to drive each transistor in word line driver circuit 2 and bit line precharge circuit 3.

Hereinafter, a description will be given of the action of the semiconductor memory device according to this exemplary embodiment configured as described above.

First, a description will be given of a case where a normal action is performed in the semiconductor memory device (a state in which power supply VDD is applied to each circuit). In this case, L level is applied to power supply cutoff signal PD, P-type MOS transistor MP1 is turned on, and power supply VDD is supplied to internal power supply VDDI. Thus, power supply VDD is supplied to each of word line driver circuit 2 and bit line precharge circuit 3.

In addition, since power supply VDD has been previously applied to memory array 10 and peripheral control circuits 20, power supply VDD is supplied to all of the circuits in the semiconductor memory device.

This state is the same as a state in which a power supply is applied to a general semiconductor memory device, and in this state, the data writing and reading actions can be normally performed in the semiconductor memory device.

Next, a description will be given of a case where power supply VDD is applied to all of the circuits in the semiconductor memory device, and the semiconductor memory device is in the inactivated state (standby state). In this case, all of word lines WL0 to WLx output L level from word line driver circuit 2. In addition, all of bit lines BL0 to BLy and NBL0 to NBLy are precharged to H level by bit line precharge circuit 3.

Since the word line WL is at L level (inactivated state), the data stored in memory cell 1 is not externally affected and can be maintained as long as power supply VDD is applied to memory cell 1.

A state of word line driver circuit 2 at this time will be described with reference to FIG. 3.

When the word line WL outputs L level, H level is applied to word line control signal NWL, N-type MOS transistor MN2 is in an on state, and P-type MOS transistor MP2 is in an off state. P-type MOS transistor MP2 is in an off state, but internal power supply VDDI (VDD power supply) is applied to the source terminal of P-type MOS transistor MP2, so that an off-leakage current flows in P-type MOS transistor MP2.

In addition, states of bit line precharge circuit 3 and memory cell 1 at this time will be described with reference to FIGS. 4 and 2.

The state is provided such that L level is stored and held in the source terminal of access transistor A1 and H level is stored and held in the source terminal of access transistor A2 in the memory cell.

When word line WL outputs L level, bit line precharge control signal NPCG becomes L level, and P-type MOS transistors MP3A to MP3C are turned on, so that bit lines BL and NBL become H level.

At the present, since the source terminal of access transistor A2 is at H level, drive transistor D1 is turned on, and the source terminal of access transistor A1 is at L level.

Since word line WL is at L level, access transistor A1 is in an off state, but internal power supply VDDI (VDD power supply) is applied from bit line precharge circuit 3 to the drain terminal of access transistor A1, so that an off-leakage current is supplied from bit line precharge circuit 3 and flows in access transistor A1.

On the other hand, in a case where H level is stored and held in the source terminal of access transistor A1, and L level is stored and held in the source terminal of access transistor A2, in memory cell 1, the off-leakage current is supplied from bit line precharge circuit 3 and flows in access transistor A2.

Next, a description will be given of a case where word line driver circuit 2 and bit line precharge circuit 3 of the semiconductor memory device are cut off from power supply VDD, and the semiconductor memory device is in the inactivated state (standby state).

In this case, H level is applied to power supply cutoff signal PD, and P-type MOS transistor MP1 is turned off, so that power supply VDD is not supplied to internal power supply VDDI (floating state is provided).

The source terminal of P-type MOS transistor MP2 becomes the floating state in word line driver circuit 2, but power supply VDD is applied to peripheral control circuits 20, so that H level is applied to word line control signal NWL. Thus, P-type MOS transistor MP2 is turned off, and N-type MOS transistor MN2 is turned on, so that all of word lines WL0 to WLx output L level, which is similar to the case where the power supply is applied to all of the circuits in the semiconductor memory device.

The source terminals of P-type MOS transistors MP3A to MP3C of bit line precharge circuit 3 become the floating state, and each of bit lines BL0 to BLy and NBL0 to NBLy is at an indefinite potential, but since all of word lines WL0 to WLx are at L level, access transistors A1 and A2 in each memory cell 1 are in an off state.

When word line WL is at L level, the data stored in memory cell 1 is not externally affected and can be maintained as long as power supply VDD is applied to memory cell 1. Therefore, even when the potentials of bit lines BL0 to BLy and NBL0 to NBLy are indefinite, the same action as the case where the power supply is applied to all of the circuits of the semiconductor memory device can be performed.

Thus, word line driver circuit 2 and bit line precharge circuit 3 of the semiconductor memory device are in the state (floating state) in which power supply VDD is not supplied to internal power supply VDDI.

Therefore, internal power supply VDDI (VDD power supply) is not applied to the source terminal of P-type MOS transistor MP2 in word line driver circuit 2, so that it is found that the off-leakage current of P-type MOS transistor MP2 is reduced.

Similarly, since internal power supply VDDI (power supply VDD) is not applied to bit line precharge circuit 3, a current is not applied from bit line precharge circuit 3 to the drain terminals of access transistors A1 and A2 in memory cell 1. Therefore, it is found that the off-leakage current of access transistors A1 and A2 are reduced.

As described above, it is found that while the semiconductor memory device is in the inactivated state (standby state), the same action can be performed in either case where word line driver circuit 2 and bit line precharge circuit 3 of the semiconductor memory device are cut off from power supply VDD or where they are not cut off therefrom, and in the case where word line driver circuit 2 and bit line precharge circuit 3 of the semiconductor memory device are cut off from power supply VDD, the off-leakage current can be reduced, so that the power consumption can be further lowered in the semiconductor memory device.

As described in SUMMARY, the leakage currents of word line driver circuit 2 and bit line precharge circuit 3 account for the majority of the leakage current of the semiconductor memory device except for the leakage current of the transistor of memory cell 1. According to this exemplary embodiment, since word line driver circuit 2 and bit line precharge circuit 3 are only cut off from power supply VDD, it is found that the leakage current can be reduced very efficiently.

In addition, since word line driver circuit 2 and bit line precharge circuit 3 are only cut off from power supply VDD, a load of internal power supply VDDI can be considerably lower than the case where all of the peripheral circuits are cut off from the power supply. Thus, it is apparent that a power supply recovery time from the standby state to the normal action in the semiconductor memory device can be faster than the case where all of the peripheral circuits are cut off from the power supply.

In addition, since word line driver circuit 2 and bit line precharge circuit 3 are only cut off from power supply VDD, the load of internal power supply VDDI can be considerably lower than the case where all of the peripheral circuits are cut off from the power supply. Therefore, it is apparent that the driving ability of the transistor (the channel width of the transistor) of the power supply cutoff switching element (P-type MOS transistor MP1 in FIG. 1) may be set smaller than the case where the power supplies to all of the peripheral circuits are cut off like PTL 1 or PTL 2. That is, an area of the semiconductor memory device can be configured to be smaller.

In addition, according to this exemplary embodiment, even when word line driver circuit 2 is cut off from power supply VDD, word line WL can be controlled to be at L level, and the word line switching element in PTL 2 is not needed, so that the area of the semiconductor memory device can be configured to be still smaller. This effect can be obtained regardless of whether or not the power supply to bit line precharge circuit 3 is cut off by the switching element (P-type MOS transistor MP1

This exemplary embodiment shows the case where there are the plurality of memory cells 1, word line driver circuits 2, and bit line precharge circuits 3, but even in a case where the number of each of them is one, it is apparent that the same action and effect can be provided.

In addition, even in a case of a memory array having a hierarchy structure having a main bit line and a sub-bit line, it is apparent that the same action and effect can be provided.

In addition, according to this exemplary embodiment, the description has been given of the case of the configuration having the complementary bit lines (paired bit lines BL and NBL), but even in a case where there is only a bit line such as a ROM (Read Only Memory), it is apparent that the same action and effect can be provided.

Second Exemplary Embodiment

Figure 5:
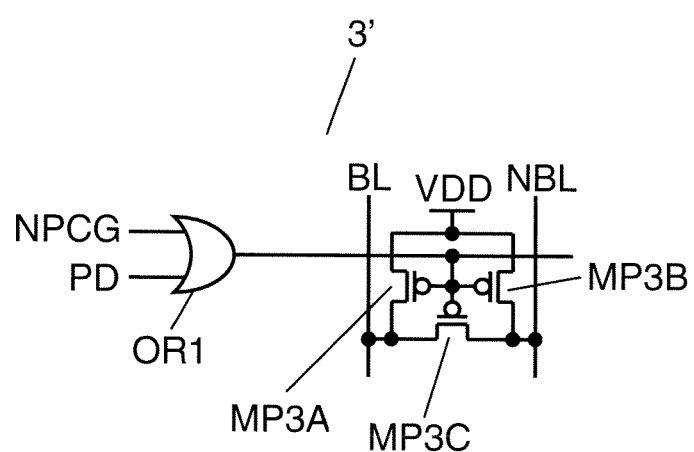
FIG. 5 is a circuit diagram showing a specific configuration of a bit line precharge circuit provided in a semiconductor memory device in a second exemplary embodiment of the present invention.

FIG. 5 is a diagram showing another example of the specific configuration of bit line precharge circuit 3 in FIG. 1.

Bit line precharge circuit 3' shown in FIG. 5 is provided with P-type MOS transistors MP3A to MP3C, and OR circuit OR1. Bit line precharge circuit 3' receives bit line precharge control signal NPCG, power supply cutoff signal PD, and power supply VDD. In addition, bit line precharge circuit 3' is connected to bit lines BL and NBL.

Gate terminals of P-type MOS transistors MP3A and MP3B are connected to an output signal of OR circuit OR1 (control signal based on power supply cutoff signal PD (first control signal)) controlled by bit line precharge control signal NPCG and power supply cutoff signal PD, drain terminals thereof are connected to bit lines BL and NBL, respectively, and source terminals thereof are connected to power supply VDD. A gate terminal of P-type MOS transistor MP3C is connected to the output signal of OR circuit OR1, and a drain terminal and a source terminal thereof are connected to bit lines BL and NBL, respectively.

Bit line precharge circuit 3' shown in FIG. 5 is different from bit line precharge circuit 3 in FIG. 4 in that power supply VDD is directly applied to the source terminals of P-type MOS transistors MP3A and MP3B, and the gate terminals of P-type MOS transistors MP3A to MP3C are controlled by the output signal of the OR circuit OR1 of bit line precharge control signal NPCG and power supply cutoff signal PD.

First, a description will be given of a case where the semiconductor memory device performs a normal action (the power supply is applied to all of the circuits).

In this case, L level is applied to power supply cutoff signal PD. Since the power supply cutoff signal PD is at L level, an input of bit line precharge control signal NPCG is outputted to the output signal of OR circuit OR1. Thus, it is found that bit line precharge circuit 3' in FIG. 5 performs the same action as that of bit line precharge circuit 3 in FIG. 4.

Next, a description will be given of a case where power supply VDD is applied to all of the circuits in the semiconductor memory device, and the semiconductor memory device is in an inactivated state (standby state).

In this case also, it is found that since L level is applied to power supply cutoff signal PD, bit line precharge circuit 3' in FIG. 5 performs the same action as that of bit line precharge circuit 3 in FIG. 4.

Next, a description will be given of a case where word line driver circuit 2 and bit line precharge circuit 3' of the semiconductor memory device are cut off from power supply VDD, and the semiconductor memory device is in the inactivated state (standby state).

In this case, H level is applied to power supply cutoff signal PD.

In the case of bit line precharge circuit 3' in FIG. 5, since power supply VDD is directly applied to the source terminals of P-type MOS transistors MP3A and MP3B, power supply VDD to bit line precharge circuit 3 in FIG. 4 is not cut off. However, since H level is applied to power supply cutoff signal PD, the output signal of OR circuit OR1 becomes H level regardless of the input of bit line precharge control signal NPCG, and all of P-type MOS transistors MP3A to MP3C are in an off state. Thus, each of bit lines BL0 to BLy and NBL0 to NBLy is at an indefinite potential (floating state), and a current from bit line precharge circuit 3' in FIG. 5 is not applied to the drain terminals of access transistors A1 and A2 in memory cell 1, so that it is found that the off-leakage current is reduced in access transistors A1 and A2.

As described above, even when bit line precharge circuit 3 in FIG. 4 is replaced with bit line precharge circuit 3' shown in FIG. 5, it is found that the same action is performed, and the same effect can be provided as those in the first exemplary embodiment.

In the case of the first exemplary embodiment, word line driver circuit 2 and bit line precharge circuit 3 are cut off from power supply VDD, but in this exemplary embodiment, bit line precharge circuit 3' is not cut off from power supply VDD but only word line driver circuit 2 is cut off from power supply VDD. Thus, a load of internal power supply VDDI is lower than that of the first exemplary embodiment, so that a power supply recovery time from the standby state to the normal action of the semiconductor memory device is still faster than that of the first exemplary embodiment.

In addition, since the load of internal power supply VDDI is lower than that of the first exemplary embodiment, a driving ability of the transistor (channel width of the transistor) of the power supply cutoff switching element (P-type MOS transistor MP1 in FIG. 1) can be set smaller than that of the first exemplary embodiment, so that an area of the semiconductor memory device can be configured to be smaller.

Third Exemplary Embodiment

Figure 6:
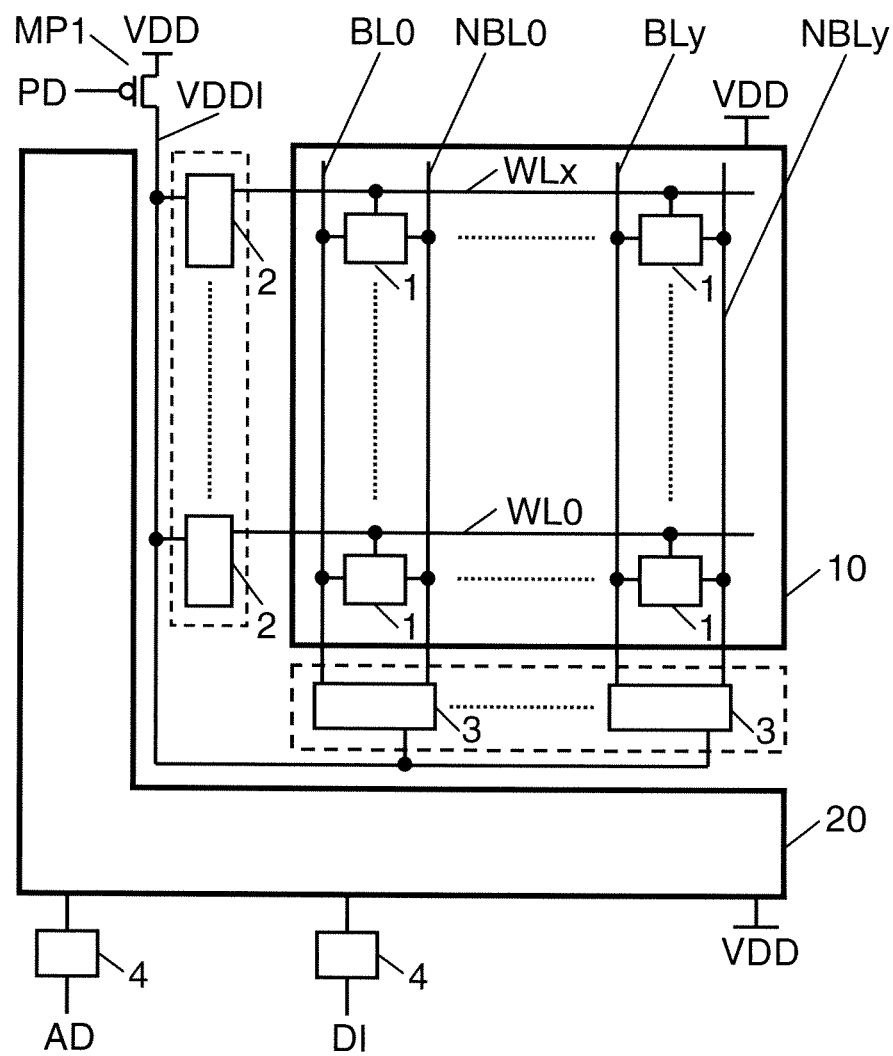
FIG. 6 is a circuit diagram showing a configuration of a semiconductor memory device in a third exemplary embodiment of the present invention.

FIG. 6 is a configuration diagram of a semiconductor memory device according to a third exemplary embodiment of the present invention.

According to the semiconductor memory device shown in FIG. 6, input circuit 4 is added, compared with the configuration shown in FIG. 1. Input circuit 4 inputs address signal AD and data signal DI, and an output of input circuit 4 is inputted to peripheral control circuit 20. A configuration other than that is the same as that shown in FIG. 1.

Each of address signal AD and data signal DI (first input signal) is inputted to the semiconductor memory device, memory cell 1 corresponding to inputted address signal AD is selected, and data of data signal DI is written in selected memory cell 1.

While the semiconductor memory device is in an inactivated state (standby state), and word line driver circuit 2 and bit line precharge circuit 3 of the semiconductor memory device are cut off from power supply VDD, the data stored in memory cell 1 is always ensured. Thus, in this state, even when the input signal (such as address signal AD and data signal D1) inputted to the semiconductor memory device is in an indefinite state (at definite potential), there is no particular problem.

However, in a case where a circuit in a first stage which receives the input signal is composed of an inverter of a CMOS in the semiconductor memory device, when the input signal (such as address signal AD or data signal DI) is inputted at an intermediate potential (indefinite state) between power supply VDD and the grounded power supply, a breakthrough current flows between power supply VDD of the CMOS inverter and the grounded power supply, so that there is an increase in power consumption.

Figure 7:
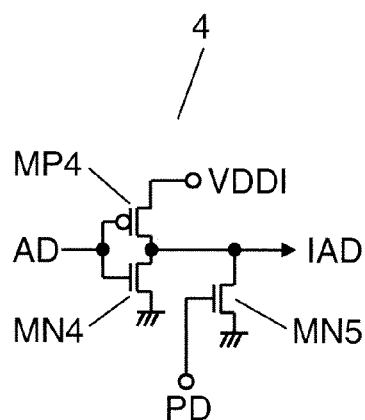
FIG. 7 is a circuit diagram showing a specific configuration of an input circuit provided in the semiconductor memory device.

FIG. 7 is one example of a specific circuit configuration of input circuit 4 in FIG. 6.

Input circuit 4 shown in FIG. 7 is provided with P-type MOS transistor MP4, and N-type MOS transistors MN4 and MN5. Address signal AD, power supply cutoff signal PD, and internal power supply VDDI are inputted to input circuit 4. Output signal IAD is outputted from input circuit 4.

A source terminal of P-type MOS transistor MP4 is connected to internal power supply VDDI. In addition, P-type MOS transistor MP4 and N-type MOS transistor MN4 compose an inverter, input signal AD is connected to the inverter, and output signal IAD of input circuit 4 is outputted. N-type MOS transistor MN5 is connected between output signal IAD of input circuit 4 and the grounded power supply, and its gate terminal is connected to power supply cutoff signal PD.

While the semiconductor memory device is in the inactivated state (standby state), and word line driver circuit 2 and bit line precharge circuit 3 of the semiconductor memory device are cut off from power supply VDD, power supply cutoff signal PD is at H level, and power supply VDD is not supplied to internal power supply VDDI (floating state). Thus, even when the input signal (such as address signal AD or data signal DI) (first input signal) is inputted at the intermediate potential (indefinite state) between power supply VDD and the grounded power supply, the breakthrough current does not flow in the inverter.

At this time, in order to prevent output signal IAD of input circuit 4 from becoming a high impedance state, and the breakthrough current from being generated in a circuit in a next stage which inputs the output signal of input circuit 4, N-type MOS transistor MN5 (low-impedance element) is turned on by power supply cutoff signal PD, and output signal IAD of input circuit 4 is fixed to L level (low-impedance state). In a case of a configuration where an inversion signal of power supply cutoff signal PD is inputted to input circuit 4, instead of N-type MOS transistor MN5, a P-type MOS transistor having a gate terminal connected to the inversion signal of power supply cutoff signal PD is to be connected between power supply VDD and output signal IAD of input circuit 4. Thus, the P-type MOS transistor is turned on by the inversion signal of power supply cutoff signal PD, so that output signal IAD of the input circuit can be fixed to H level (low-impedance state).

According to the above configuration, the breakthrough current can be prevented from flowing in input circuit 4.

According to this exemplary embodiment, the description has been given of the case of address signal AD, but even when the configuration shown in this exemplary embodiment is applied to data signal DI, or another input signal inputted to the semiconductor memory device, it is apparent that the same effect can be provided.

Figure 8:
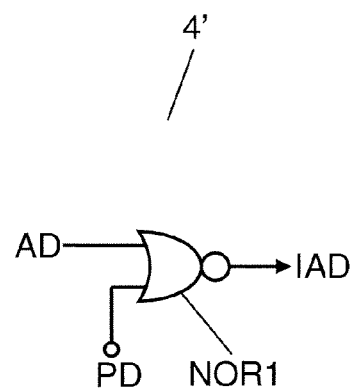
FIG. 8 is a circuit diagram showing another example of a specific configuration of an input circuit.

FIG. 8 shows another example of the specific circuit configuration of input circuit 4 in FIG. 6.

In the case where the circuit in the first stage which receives the input signal is composed of, for example, the inverter of the CMOS in the semiconductor memory device, when the input signal (such as address signal AD or data signal DI) is inputted at the intermediate potential (indefinite state) between power supply VDD and the grounded power supply, the breakthrough current flows between power supply VDD of the CMOS inverter and the grounded power supply, so that the problem is that the power consumption is increased. In order to solve the problem, input circuit 4' shown in FIG. 8 is provided with CMOS NOR circuit NOR1 which inputs address signal AD and power supply cutoff signal PD, and outputs output signal IAD of input circuit 4'. Power supply VDD is supplied to CMOS NOR circuit NOR1.

In the case of CMOS NOR circuit NOR1, when one input (power supply cutoff signal PD) is at H level, an output is determined regardless of another input (address signal AD), and even when the potential of the other input (address signal AD) is inputted at the intermediate potential (indefinite state) between power supply VDD and the grounded power supply, the breakthrough current does not flow. That is, it is apparent that the same effect as that of the configuration shown in FIG. 7 can be obtained.

Figure 9:
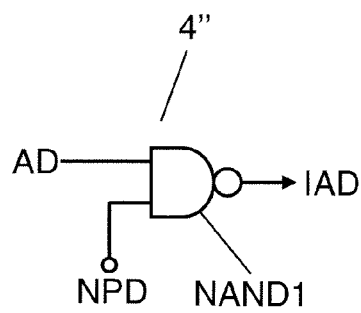
FIG. 9 is a circuit diagram showing still another example of a specific configuration of an input circuit.

FIG. 9 shows a further another example of the specific circuit configuration of input circuit 4 in FIG. 6.

In a case of input circuit 4" shown in FIG. 9, inversion signal NPD of power supply cutoff signal (PD) is inputted. In this case, instead of CMOS NOR circuit NOR1 in FIG. 8, CMOS NAND circuit NAND1 may be provided. Power supply VDD is supplied to CMOS NAND circuit NAND1.

In the case of CMOS NAND circuit NAND1, when one input (inversion signal NPD of power supply cutoff signal) is at L level, an output is determined regardless of another input (address signal AD), and even when the potential of the other input (address signal AD) is inputted at the intermediate potential (indefinite state) between power supply VDD and the grounded power supply, the breakthrough current does not flow. That is, it is apparent that the same effect as that of the configuration shown in FIG. 7 or FIG. 8 can be obtained.

According to the configurations shown in FIGS. 8 and 9, the description has been given of the case of address signal AD, but even when the configuration shown in this exemplary embodiment is applied to data signal DI, or another input signal inputted to the semiconductor memory device, it is apparent that the same effect can be provided.

Fourth Exemplary Embodiment

Next, a description will be given of the semiconductor memory device according to a fourth exemplary embodiment of the present invention.

In general, the off-leakage current of the MOS transistor in the semiconductor memory device is reduced by increasing a channel length of the transistor. In addition, by increasing a gate oxide film thickness of the MOS transistor, the off-leakage current is reduced. In addition, by increasing an impurity concentration injected into a diffusion region of the MOS transistor, and increasing an absolute value of a threshold voltage of the transistor, the off-leakage current can be reduced. In addition, by applying reverse bias to a substrate power supply of the MOS transistor (applying a voltage equal to or higher than a voltage which is applied to the source terminal, to the substrate in the case of the P-type MOS transistor, and applying a voltage equal to or lower than a voltage which is applied to the source terminal, to the substrate in the case of the N-type MOS transistor), the off-leakage current can be reduced.

According to the semiconductor memory device in FIG. 1, the off-leakage current flows in P-type MOS transistor MP1 for cutting off power supply VDD and internal power supply VDDI while the power supply is cut off (power supply cutoff signal PD is at H level, and P-type MOS transistor MP1 is in an off state).

As for the semiconductor memory device, the channel length of the transistor having the same polarity in the circuit except for memory cell 1 is designed to have the same length in general, but when a channel length of P-type MOS transistor MP1 is designed to be longer than a channel length of P-type MOS transistor MP2 in word line driver circuit 2, the off-leakage current of P-type MOS transistor MP1 can be reduced, and the power consumption can be low in the semiconductor memory device.

In addition, as for the semiconductor memory device, the gate oxide film of the MOS transistor having the same polarity has the same thickness in general, but when a gate oxide film of P-type MOS transistor MP1 is designed to be thicker than a gate oxide film of P-type MOS transistor MP2 in word line driver circuit 2, the off-leakage current of P-type MOS transistor MP1 can be reduced, and the power consumption can be low in the semiconductor memory device.

In addition, as for the semiconductor memory device, the impurity concentration injected into the diffusion region of the MOS transistor having the same polarity formed in the region except for memory array 10 is the same in general, but when an impurity concentration injected into the diffusion region of P-type MOS transistor MP1 is designed to be higher than an impurity concentration injected into the diffusion region of P-type MOS transistor MP2 in word line driver circuit 2 to increase the absolute value of the threshold voltage of the MOS transistor, the off-leakage current of P-type MOS transistor MP1 can be reduced, and the power consumption can be low in the semiconductor memory device.

In addition, as for the semiconductor memory device, the same potential is applied to the substrate power supply of the MOS transistor having the same polarity in general, but when a potential equal to or higher than that of the substrate power supply of P-type MOS transistor MP2 in word line driver circuit 2 is applied to the substrate power supply of P-type MOS transistor MP1, the off-leakage current of P-type MOS transistor MP1 can be reduced, and the power consumption can be low in the semiconductor memory device.

In the above, the transistor in word line driver circuit 2 has been described, but it is apparent that another transistor composing the semiconductor memory device has the same effect.

Fifth Exemplary Embodiment

Figure 10:
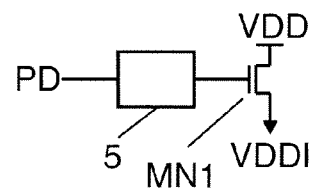
FIG. 10 is a diagram showing a specific configuration in a case where a power supply cutoff switching element is composed of an N-type MOS transistor in a semiconductor memory device in a fifth exemplary embodiment of the present invention.

FIG. 10 is a diagram showing one example of a specific configuration in which P-type MOS transistor MP1 serving as the power supply cutoff switching element in FIG. 1 is replaced with an N-type MOS transistor.

The configuration shown in FIG. 10 is provided with N-type MOS transistor MN1 and level-shift circuit 5. Power supply cutoff signal PD is inputted to level-shift circuit 5.

N-type MOS transistor MN1 has a source terminal connected to power supply VDD, and a drain terminal connected to internal power supply VDDI.

Level-shift circuit 5 inputs power supply cutoff signal PD, and outputs an inversion level of power supply cutoff signal PD to a gate terminal of N-type MOS transistor MN1. At this time, when power supply cutoff signal PD is at L level, H level provided by voltage conversion to be a potential equal to or higher than the potential of power supply VDD is outputted.

While L level is applied to power supply cutoff signal PD (power supply is not cut off), H level is applied to the gate terminal of N-type MOS transistor MN1, and N-type MOS transistor MN1 is turned on, so that power supply VDD is supplied to internal power supply VDDI. In addition, when H level is applied to power supply cutoff signal PD (power supply is cut off), L level is applied to the gate terminal of N-type MOS transistor MN1, and N-type MOS transistor MN1 is turned off, so that power supply VDD is not supplied to internal power supply VDDI (floating state).

In the case of the N-type MOS transistor, the same potential as that applied to the source terminal (power supply VDD) can be outputted to the drain terminal (internal power supply VDDI), by adding a potential provided by adding the threshold voltage of the N-type MOS transistor to the potential applied to the source terminal, to the gate terminal of the N-type MOS transistor.

Thus, in the case of the configuration in FIG. 10, level-shift circuit 5 capable of converting the voltage of the input signal and outputting it is inserted in a previous stage of N-type MOS transistor MN1. Indeed, when configured such that the voltage equal to or higher than the power supply VDD is supplied as power supply cutoff signal PD, level-shift circuit 5 is not needed.

As described above, even when the P-type MOS transistor serving as the power supply cutoff switching element is replaced with the N-type MOS transistor, it is found that the same action and effect as those in the first and second exemplary embodiments are provided.

In general, as for the driving ability of the P-type MOS transistor and the driving ability of N-type MOS transistor which have the same channel width and channel length, the driving ability of N-type MOS transistor is higher. Thus, in the case where the P-type MOS transistor and the N-type MOS transistor have the same driving ability, the N-type MOS transistor can be smaller in area.

That is, when the power supply cutoff switching element is composed of the N-type MOS transistor like this exemplary embodiment, the area of the semiconductor memory device can be smaller.

As described in the fourth exemplary embodiment, the off-leakage current of the MOS transistor in the semiconductor memory device can be reduced by increasing the channel length of the transistor. In addition, by increasing the gate oxide film thickness of the MOS transistor, the off-leakage current is reduced. In addition, the off-leakage current can be reduced by increasing the impurity concentration injected into the diffusion region of the MOS transistor and increasing the absolute value of the threshold voltage of the transistor. Furthermore, the off-leakage current can be reduced by applying the reverse bias to the substrate power supply of the MOS transistor.

In FIG. 10, the off-leakage current flows in N-type MOS transistor MN1 for cutting off power supply VDD and internal power supply VDDI while the power supply is cut off (power supply cutoff signal PD is at H level, and N-type MOS transistor MN1 is in an off state)

As for the semiconductor memory device, the channel length of the transistor having the same polarity in the circuit except for memory cell 1 is designed to have the same length in general, but when a channel length of N-type MOS transistor MN1 is designed to be longer than a channel length of N-type MOS transistor MN2 in word line driver circuit 2, the off-leakage current of N-type MOS transistor MN1 can be reduced, and the power consumption can be low in the semiconductor memory device.

In addition, as for the semiconductor memory device, the gate oxide film of the MOS transistor having the same polarity has the same thickness in general, but when a gate oxide film of N-type MOS transistor MN1 is designed to be thicker than a gate oxide film of N-type MOS transistor MN2 in word line driver circuit 2, the off-leakage current of N-type MOS transistor MN1 can be reduced, and the power consumption can be low in the semiconductor memory device.

In addition, as for the semiconductor memory device, the impurity concentration in the region except for memory array 10 is the same impurity concentration in general, but when an impurity concentration injected into the diffusion injected into the diffusion region of the MOS transistor having the same polarity formed region of N-type MOS transistor MN1 is designed to be higher than an impurity concentration injected into the diffusion region of N-type MOS transistor MN2 in word line driver circuit 2 to increase the threshold voltage of the MOS transistor, the off-leakage current of N-type MOS transistor MN1 can be reduced, and the power consumption can be low in the semiconductor memory device.

In addition, as for the semiconductor memory device, the same potential is applied to the substrate power supply of the MOS transistor having the same polarity in general, but when a potential equal to or lower than that of the substrate power supply of N-type MOS transistor MN2 in word line driver circuit 2 is applied to the substrate power supply of N-type MOS transistor MN1, the off-leakage current of N-type MOS transistor MN1 can be reduced, and the power consumption can be low in the semiconductor memory device.

In the above, the transistors in the word line driver circuit have been described, but it is apparent that another transistor composing the semiconductor memory device has the same effect.

Sixth Exemplary Embodiment

Figure 11A:
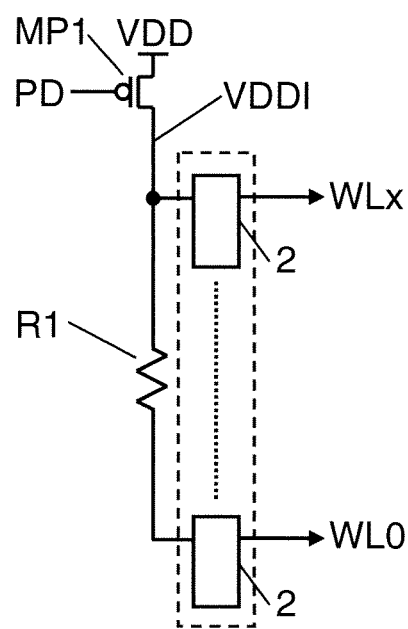
FIG. 11A is a diagram showing a point of a power supply cutoff switching element in a semiconductor memory device in a sixth exemplary embodiment of the present invention.
Figure 11B:
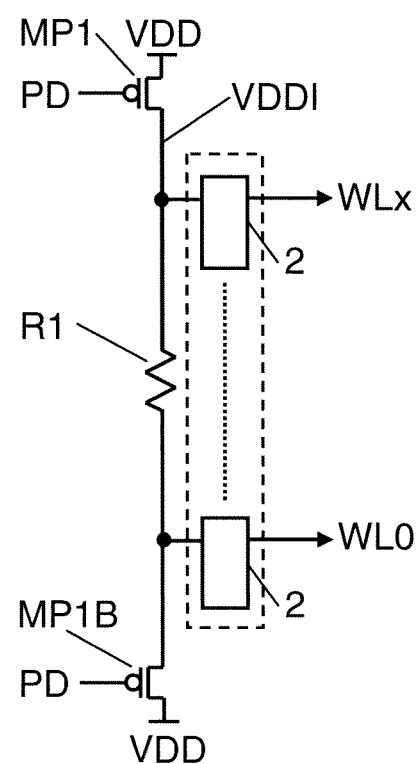
FIG. 11B is a diagram showing another example of a point of power supply cutoff switching elements in the semiconductor memory device in the sixth exemplary embodiment of the present invention.

FIGS. 11A and 11B are diagrams showing points of power supply cutoff switching elements in the word line driver circuit according to a sixth exemplary embodiment of the present invention.

FIG. 11A is the diagram provided by extracting P-type MOS transistor MP1 serving as the power supply cutoff switching element for word line driver circuit 2, word line driver circuit 2, word lines WL0 to WLx outputted from word line driver circuits 2, power supply VDD, and internal power supply VDDI, from the configuration in FIG. 1. In addition, the configuration shown in FIG. 11A is provided with wiring resistance R1 of internal power supply VDDI.

FIG. 11B shows a configuration in which P-type MOS transistor MP1B serving as a power supply cutoff switching element for word line driver circuit 2 is added to a side of word line driver circuit 2 outputting word line WL0 compared with the configuration in FIG. 11A. The configuration shown in FIG. 11B is provided with wiring resistance R1 of internal power supply VDDI.

P-type MOS transistor MP1B has a gate terminal connected to power supply cutoff signal PD, a source terminal connected to power supply VDD, and a drain terminal connected to internal power supply VDDI, and executes the same action as that of P-type MOS transistor MP1 in FIG. 11A or 11B.

The difference is that power supply VDD is supplied to internal power supply VDDI from one point in FIG. 11A, while from two points in FIG. 11B.

In the case of FIG. 11A in which power supply VDD is supplied from one point, as for a voltage drop generated due to wiring resistance R1 of internal power supply VDDI, the voltage drop is smallest in the power supply terminal of word line driver circuit 2 outputting word line WLx (source terminal of P-type MOS transistor MP2 in FIG. 3) which is provided closest to the power supply point, while the voltage drop is largest in the power supply terminal of word line driver circuit 2 outputting word line WL0 which is provided farthest from the power supply point.

In addition, in recovering the power supply from the power supply cutoff state, the recovery is latest in word line driver circuit 2 outputting word line WL0 which is provided farthest from the power supply point.

As shown in FIG. 11B, P-type MOS transistor MP1 and P-type MOS transistor MP1B are provided in upper and lower parts of a column of the word line driver circuits, and the two power supply points are provided, so that the voltage drop generated in the power supply terminal of each word line driver circuit 2 can be smaller, and it is apparent that the time required for recovering the power supply from the power supply cutoff state can be shortened in each word line driver circuit 2. In addition, even when configured such that P-type MOS transistor MP1 and P-type MOS transistor MP1B are arranged right and left of the column of the word line driver circuits, it is apparent that the same effect can be obtained.

According to this exemplary embodiment, the description has been given of the case where the one or two power supply points are provided, but when the three or more power supply points are provided, it is apparent that the voltage drop further becomes small, and the power supply recovery time is further shortened.

Figure 12:
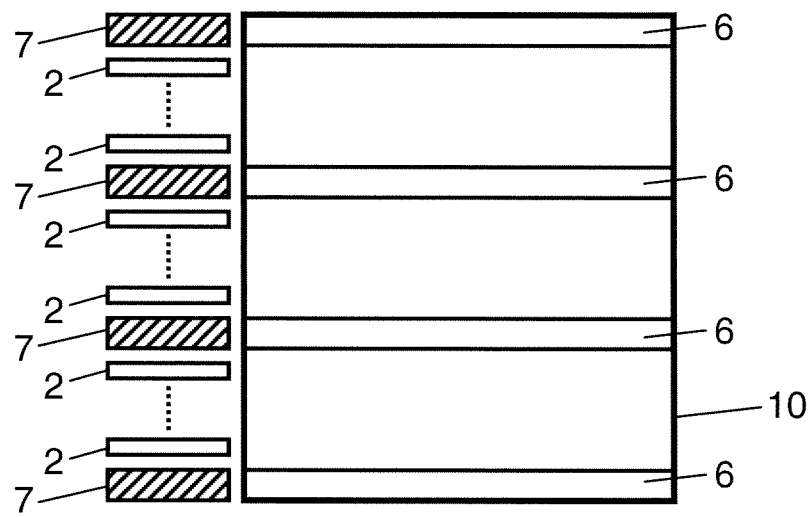
FIG. 12 is a layout diagram showing an arrangement of a word line driver circuit and the power supply cutoff switching element in the semiconductor memory device in the sixth exemplary embodiment of the present invention.

FIG. 12 is a layout diagram showing arrangement of word line driver circuits 2 and the power supply cutoff switching elements in the semiconductor memory device.

The layout diagram of the semiconductor memory device shown in FIG. 12 is provided with word line driver circuit 2, substrate power supply region 6 for the memory cell, region 7 for arranging the power supply cutoff switching element, and memory array 10.

In the semiconductor memory device, substrate power supply regions 6 for supplying the substrate power supply of memory cell 1 in memory array 10 are arranged at regular intervals in memory array 10, and word line driver circuits 2 are arranged adjacent to memory array 10.

Thus, as shown in FIG. 12, free spaces (region 7 for arranging the power supply cutoff switching element) are generated in places adjacent to substrate power supply regions 6, in the column of the word line driver circuits.

Therefore, when the power supply cutoff switching element is arranged in this free space, that is, when the switching element is arranged adjacent to the substrate power supply region 6 of the memory cell, there is no increase in area of the semiconductor memory device, so that the area of the semiconductor memory device can be smaller.

In addition, the configuration for word line driver circuit 2 has been described in this exemplary embodiment, but when the same configuration is set for bit line precharge circuit 3, it is apparent that the same effect as that of word line driver circuit 2 can be obtained.

FIG. 11B shows the configuration in which the two switching elements are arranged near word line driver circuit 2, but a drawing showing a configuration in which the two switching elements are arranged in peripheral control circuits 20, or near bit line precharge circuit 3 is the same as the above, so that it is omitted.

Seventh Exemplary Embodiment

Figure 13:
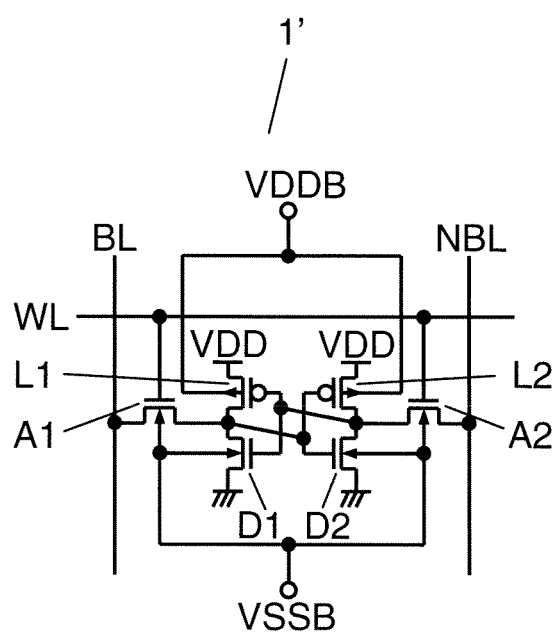
FIG. 13 is a diagram showing a specific configuration of memory cell 1' provided in a semiconductor memory device in a seventh exemplary embodiment of the present invention.

FIG. 13 is a diagram showing another example of the specific configuration (FIG. 2) of memory cell 1 in FIG. 1.

Memory cell 1' shown in FIG. 13 is provided with access transistors A1 and A2, drive transistors D1 and D2, and load transistors L1 and L2. Memory cell 1' is connected to word line WL, bit lines BL and NBL, and power supply VDD. Substrates of load transistors L1 and L2 are connected to substrate power supply (first substrate power supply) VDDB, and access transistors A1 and A2 and drive transistors D1 and D2 are connected to substrate power supply (second substrate power supply) VSSB.

It differs from memory cell 1 in FIG. 2 only in that substrate power supply VDDB of load transistors L1 and L2 serving as the P-type MOS transistors, and substrate power supplies VSSB of access transistors A1 and A2 and drive transistors D1 and D2 serving as the N-type MOS transistors are configured to be independently controlled, and an action of memory cell 1' in FIG. 13 executes the same action as that of memory cell 1 in FIG. 2.

In general, the off-leakage current of the MOS transistor in the semiconductor memory device can be reduced by applying the reserve bias to the substrate power supply of the MOS transistor (applying the voltage equal to or higher than the voltage which is applied to the source terminal, to the substrate in the case of the P-type MOS transistor, and applying the voltage equal to or lower than the voltage which is applied to the source terminal, to the substrate in the case of the N-type MOS transistor).

Thus, by applying the potential equal to or higher than power supply VDD to the substrate power supply VDDB of load transistors L1 and L2 serving as the P-type MOS transistors, the off-leakage currents of load transistors L1 and L2 can be reduced, and the power consumption can be low in the semiconductor memory device.

Similarly, by applying the potential equal to or lower than the grounded power supply (power supply applied to the source terminals of drive transistors D1 and D2) to the substrate power supply VSSB of access transistors A1 and A2 and drive transistors D1 and D2 serving as the N-type MOS transistors, the off-leakage current of access transistors A1 and A2 and drive transistors D1 and D2 can be reduced, and the power consumption can be low in the semiconductor memory device.

In addition, it is not necessary to apply the potential equal to or higher than power supply VDD to the substrate power supply VDDB of load transistors L1 and L2 serving as the P-type MOS transistors, and apply the potential equal to or lower than the grounded power supply to the substrate power supply VSSB of access transistors A1 and A2 and drive transistors D1 and D2 serving as the N-type MOS transistors, but it is only necessary to apply the potential equal to or higher than power supply VDD to the substrate power supply VDDB of load transistors L1 and L2 serving as the P-type MOS transistors, or apply the potential equal to or lower than the grounded power supply to the substrate power supply VSSB of access transistors A1 and A2 and drive transistors D1 and D2 serving as the N-type MOS transistors.

By applying the reverse bias to the substrate power supply of the MOS transistor, the off-leakage current of the MOS transistor can be reduced. However, compared with the case of the MOS transistor to which the reverse bias is not applied, the driving ability is reduced under a condition that the transistor is on, and as a result, the performance of the semiconductor memory device is degraded. Thus, while the semiconductor memory device executes the normal action (not in the standby state), the reverse bias is not to be applied to the substrate power supply of memory cell 1'.

According to a method for switching the substrate power supply of memory cell 1', two switching elements (P-type MOS transistors) controlled by power supply cutoff signal PD and the inversion signal of power supply cutoff signal PD are provided, an input of the one switching element is connected to substrate power supply VDDB having the potential equal to or higher than power supply VDD, and an input of the other switching element is connected to power supply VDD. Outputs of the switching elements are connected in common, and the outputs of the switching elements are connected to the substrate power supply of load transistors L1 and L2 of memory cell 1'.

When power supply cutoff signal PD is at L level (case where the semiconductor memory device executes the normal action), the switching element (P-type MOS transistor) connected to power supply VDD is turned on, and power supply VDD is applied to the substrate power supply of load transistors L1 and L2 of memory cell 1'. When power supply cutoff signal PD is at H level (word line driver circuit 2 and bit line precharge circuit 3 of semiconductor memory device are cut off from power supply VDD), the switching element connected to substrate power supply VDDB is turned on, and substrate power supply VDDB is applied to the substrate power supply of load transistors L1 and L2 of memory cell 1'.

Similarly, two switching elements (N-type MOS transistors) controlled by power supply cutoff signal PD and the inversion signal of power supply cutoff signal PD are provided, an input of the one switching element is connected to substrate power supply VSSB having the potential equal to or lower than the grounded power supply, and an input of the other switching element is connected to the grounded power supply. Outputs of the switching elements are connected in common, and the outputs of the switching elements are connected to the substrate power supplies of access transistors A1 and A2 and drive transistors D1 and D2 of memory cell 1'.

When power supply cutoff signal PD is at L level (case where the semiconductor memory device executes the normal action), the switching element (N-type MOS transistor) connected to the grounded power supply is turned on, and the grounded power supply is applied to the substrate power supply of access transistors A1 and A2 and drive transistors D1 and D2 of memory cell 1'. When power supply cutoff signal PD is at H level (word line driver circuit 2 and bit line precharge circuit 3 of semiconductor memory device are cut off from power supply), the switching element connected to substrate power supply VSSB is turned on, and substrate power supply VSSB is applied to the substrate power supply of access transistors A1 and A2 and drive transistors D1 and D2 of memory cell 1'.

As described above, when configured such that the reverse bias is applied to the substrate power supply of memory cell 1' only while word line driver circuit 2 and bit line precharge circuit 3 of semiconductor memory device are cut off from power supply VDD, the performance of the semiconductor memory device is not degraded at the time of the normal action, and while word line driver circuit 2 and bit line precharge circuit 3 of semiconductor memory device are cut off from power supply VDD, the semiconductor memory device can be low in power consumption.

When power supply cutoff signal PD is at H level, and word line driver circuit 2 and bit line precharge circuit 3 of semiconductor memory device are cut off from power supply VDD, word line WL is at L level, and access transistors A1 and A2 are both off. Thus, as long as power supply VDD is supplied to the source terminals of the load transistors L1 and L2 of memory cell 1', the data stored in the flip-flop is not externally affected, and the same stored data can be maintained.

According to memory cell 1', load transistor L1 and drive transistor D1 or load transistor L2 and drive transistor D2 constitute an inverter, and a flip-flop is formed by connecting the input and output terminals of the inverters to store and hold the data.

The flip-flop in memory cell 1' is normally activated to normally store and hold the data by applying a voltage capable of turning on load transistors L1 and L2 or drive transistors D1 and D2. That is, as long as the voltage of the threshold voltage having higher absolute value of the threshold voltages of load transistor L1 (or L2), or drive transistor D1 (or D2) is applied to power supply VDD, the data can be normally stored and maintained in memory cell 1'.

When the potential of power supply VDD applied to the source terminals of load transistors L1 and L2 in memory cell 1' is reduced, the leakage current of memory cell 1' is reduced, so that the power consumption can be low in the semiconductor memory device.

For example, two switching elements (P-type MOS transistor) controlled by power supply cutoff signal PD and the inversion signal of power supply cutoff signal PD are provided, an input of the one switching element is connected to a power supply (such as power supply VDD2) having a potential equal to or lower than power supply VDD, and an input of the other switching element is connected to power supply VDD. Outputs of the switching elements are connected in common, and the outputs of the switching elements are connected to the source terminals of load transistors L1 and L2 of memory cell F.

When power supply cutoff signal PD is at L level (case where the semiconductor memory device executes the normal action), the switching element (P-type MOS transistor) connected to power supply VDD is turned on, and power supply VDD is applied to memory cell 1'. When power supply cutoff signal PD is at H level (case where word line driver circuit 2 and bit line precharge circuit 3 of semiconductor memory device are cut off from power supply VDD), the switching element connected to power supply VDD2 is turned on, and power supply VDD2 having a potential equal to or lower than power supply VDD is applied to memory cell 1'.

As described above, when configured such that the power supply applied to memory cell l' is reduced while word line driver circuit 2 and bit line precharge circuit 3 of the semiconductor memory device are cut off from power supply VDD, the power consumption can be low in the semiconductor memory device.

Eighth Exemplary Embodiment

Next, an eighth exemplary embodiment of the present invention will be described.

The description has been given of the actions to control the substrate power supply of load transistors L1 and L2 and the substrate power supply of access transistors A1 and A2 and drive transistors D1 and D2 in memory cell 1' in the seventh exemplary embodiment, but even when the substrate power supply of the P-type MOS transistor or the substrate power supply of the N-type MOS transistor provided in peripheral control circuit 20 in FIG. 1 is controlled, the same effect can be obtained.

In general, the off-leakage current of the MOS transistor in the semiconductor memory device can be reduced by applying the reserve bias to the substrate power supply of the MOS transistor (applying the voltage equal to or higher than the voltage which is applied to the source terminal, to the substrate in the case of the P-type MOS transistor, and applying the voltage equal to or lower than the voltage which is applied to the source terminal, to the substrate in the case of the N-type MOS transistor).

Thus, by applying the potential equal to or higher than power supply VDD to the substrate power supply (third substrate power supply) (such as substrate power supply VDPB) of the P-type MOS transistor in peripheral control circuit 20, the off-leakage current of the P-type MOS transistor in peripheral control circuits 20 can be reduced, and the power consumption can be low in the semiconductor memory device.

Similarly, by applying the potential equal to or lower than the grounded power supply (power supply applied to the source terminal of the N-type MOS transistor) to the substrate power supply (fourth substrate power supply) (such as substrate power supply VSPB) of the N-type MOS transistor in peripheral control circuit 20, the off-leakage current of the N-type MOS transistor in peripheral control circuit 20 can be reduced, and the power consumption can be low in the semiconductor memory device.

By applying the reverse bias to the substrate power supply of the MOS transistor, the off-leakage current of the MOS transistor can be reduced. However, compared with the case of the MOS transistor to which the reverse bias is not applied, the driving ability is reduced under a condition that the transistor is on, and as a result, the performance of the semiconductor memory device is degraded. Thus, while the semiconductor memory device executes the normal action (not in the standby state), the reverse bias is not to be applied to the substrate power supply of the MOS transistor in peripheral control circuit 20.

According to a method for switching the substrate power supply of the MOS transistor in peripheral control circuit 20, two switching elements (P-type MOS transistors) controlled by power supply cutoff signal PD and the inversion signal of power supply cutoff signal PD are provided, an input of the one switching element is connected to substrate power supply VDPB having a potential equal to or higher than power supply VDD, and an input of the other switching element is connected to power supply VDD. Outputs of the switching elements are connected in common, and the outputs of the switching elements are connected to the substrate power supply of the P-type MOS transistor in peripheral control circuit 20.

When power supply cutoff signal PD is at L level (case where the semiconductor memory device executes the normal action), the switching element (P-type MOS transistor) connected to power supply VDD is turned on, and power supply VDD is applied to the substrate power supply of the P-type MOS transistor in peripheral control circuit 20. When power supply cutoff signal PD is at H level (case where word line driver circuit 2 and bit line precharge circuit 3 of semiconductor memory device are cut off from power supply VDD), the switching element connected to substrate power supply VDPB is turned on, and substrate power supply VDPB is applied to the substrate power supply of the P-type MOS transistor in peripheral control circuit 20.

Similarly, two switching elements (N-type MOS transistor) controlled by power supply cutoff signal PD and the inversion signal of power supply cutoff signal PD are provided, an input of the one switching element is connected to substrate power supply VSPB having the potential equal to or lower than grounded power supply, and an input of the other switching element is connected to the grounded power supply. Outputs of the switching elements are connected in common, and the outputs of the switching elements are connected to the substrate power supply of the N-type MOS transistor in peripheral control circuit 20.

When power supply cutoff signal PD is at L level (case where the semiconductor memory device executes the normal action), the switching element (N-type MOS transistor) connected to the grounded power supply is turned on, and the grounded power supply is applied to the substrate power supply of the N-type MOS transistor in peripheral control circuits 20. When power supply cutoff signal PD is at H level (case where word line driver circuit 2 and bit line precharge circuit 3 of semiconductor memory device are cut off from power supply VDD), the switching element connected to substrate power supply VSPB is turned on, and substrate power supply VSPB is applied to the substrate power supply of the N-type MOS transistor in peripheral control circuit 20.

As described above, when configured such that the reverse bias is applied to the substrate power supply of the MOS transistor in peripheral control circuit 20 only while word line driver circuit 2 and bit line precharge circuit 3 of semiconductor memory device are cut off from power supply VDD, the performance of the semiconductor memory device is not degraded at the time of the normal action, and while word line driver circuit 2 and bit line precharge circuit 3 of semiconductor memory device are cut off from power supply VDD, the semiconductor memory device can be low in power consumption.

In addition, as described in the seventh exemplary embodiment, when configured such that the power supply applied to the memory cell 1' is reduced while word line driver circuit 2 and bit line precharge circuit 3 of the semiconductor memory device are cut off from power supply VDD, it is apparent that the power consumption can be lower in the semiconductor memory device.

That is, by controlling the first power supply connected to memory cell 1' so that its voltage becomes equal to or lower than the voltage provided when the switching element is on while the switching element is off, the power consumption can be further controlled in the semiconductor memory device.

Ninth Exemplary Embodiment

Figure 14:
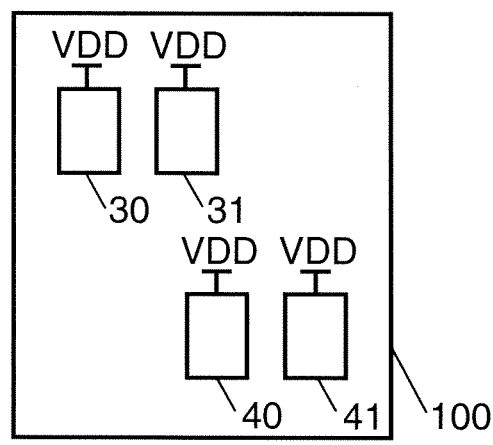
FIG. 14 is a circuit diagram showing a configuration of a semiconductor integrated circuit in a ninth exemplary embodiment of the present invention.

FIG. 14 is a configuration diagram of a semiconductor integrated circuit according to a ninth exemplary embodiment of the present invention.

Semiconductor integrated circuit 100 shown in FIG. 14 is provided with semiconductor memory devices 30 and 31, and other semiconductor memory devices 40 and 41, and power supply VDD is supplied to semiconductor integrated circuit 100.

Semiconductor memory devices 30, 31, 40, and 41 each receiving power supply VDD are mounted on semiconductor integrated circuit 100, and each of semiconductor memory devices 30, 31, 40, and 41 executes the same action as that of the semiconductor memory device in FIG. 1. In addition, an absolute value of a threshold voltage of a transistor in each of semiconductor memory devices 40 and 41 is set higher than an absolute value of a threshold voltage (Vt) of a transistor in each of semiconductor memory devices 30 and 31. Each of semiconductor memory devices 30 and 31 is referred to as the semiconductor memory device composed of a low-Vt transistor, and each of other semiconductor memory devices 40 and 41 is referred to as the semiconductor memory device composed of a high-Vt transistor.

In general, the off-leakage current of the MOS transistor in the semiconductor memory device is reduced by increasing the absolute value of the threshold voltage of the transistor. Thus, semiconductor memory devices 40 and 41 composed of the high-Vt transistor consume less power than semiconductor memory devices 30 and 31 composed of the low-Vt transistor.

Thus, as for semiconductor memory devices 40 and 41 composed of the high-Vt transistor, there is almost no need to cut off word line driver circuit 2 and bit line precharge circuit 3 of the semiconductor memory device in FIG. 1 from power supply VDD. Therefore, it is more effective to remove the power supply cutoff switching element (P-type MOS transistor MP1 in FIG. 1) to reduce the area of semiconductor memory devices 40 and 41, and as a result, to reduce the area of semiconductor integrated circuit 100.

As described above, in the case where the semiconductor memory devices having different absolute values of the threshold voltages of the transistors are provided in semiconductor integrated circuit 100, when configured such that word line driver circuit 2 and bit line precharge circuit 3 of the semiconductor memory device can be cut off from power supply VDD only in semiconductor memory devices 30 and 31 composed of the low-Vt transistor, the semiconductor integrated circuit can be low in power consumption and small in area.

According to this exemplary embodiment, the description has been given of the case where the semiconductor memory devices composed of the two kinds of Vt transistors are provided in the semiconductor integrated circuit, but even in a case where the semiconductor memory devices composed of the two or more kinds of Vt transistors are provided in the semiconductor integrated circuit, when the semiconductor integrated circuit is configured based on the same idea as the above, it is apparent that the semiconductor integrated circuit can be low in power consumption and small in area.

Tenth Exemplary Embodiment

Figure 15:
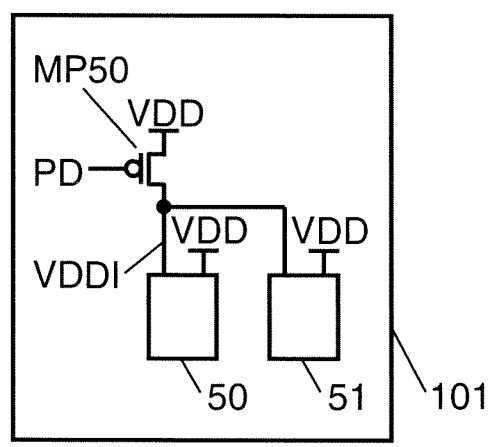
FIG. 15 is a circuit diagram showing a configuration of a semiconductor integrated circuit in a tenth exemplary embodiment of the present invention.

FIG. 15 is a configuration diagram of a semiconductor integrated circuit according to a tenth exemplary embodiment of the present invention.

Semiconductor integrated circuit 101 shown in FIG. 15 is provided with semiconductor memory devices 50 and 51, and P-type MOS transistor MP50. Power supply cutoff signal PD is inputted to a gate of P-type MOS transistor MP50. Internal power supply VDDI and power supply VDD are connected to semiconductor memory devices 50 and 51.

P-type MOS transistor (switching element) MP50 is controlled by power supply cutoff signal PD, power supply VDD is connected to its source terminal, internal power supply VDDI is connected to its drain terminal, and internal power supply VDDI is supplied to each of semiconductor memory devices 50 and 51. In addition, each of semiconductor memory devices 50 and 51 does not have the power supply cutoff switching element (P-type MOS transistor MP1) controlled by power supply cutoff signal PD in the semiconductor memory device shown in FIG. 1.

That is, FIG. 15 shows a configuration having the one power supply cutoff switching element (P-type MOS transistor MP50) controlled by power supply cutoff signal PD in semiconductor integrated circuit 101. According to semiconductor integrated circuit 101, one switching element MP50 can cut off power supplies VDD to word line driver circuit 2 and bit line precharge circuit 3 in each of semiconductor memory devices 50 and 51 at the same time.

According to the above configuration, since there is no need to provide the power supply cutoff switching element (P-type MOS transistor MP1 in FIG. 1) in the semiconductor memory device, the area of the semiconductor memory device can be small, and the area of semiconductor integrated circuit 101 can be small.

In addition, according to this exemplary embodiment, the description has been given of the case where two semiconductor memory devices 50 and 51 are provided in semiconductor integrated circuit 101, but even in a case where two or more semiconductor memory devices are provided in the semiconductor integrated circuit, it is apparent that the same effect can be obtained.

Variation of Tenth Exemplary Embodiment

Figure 16:
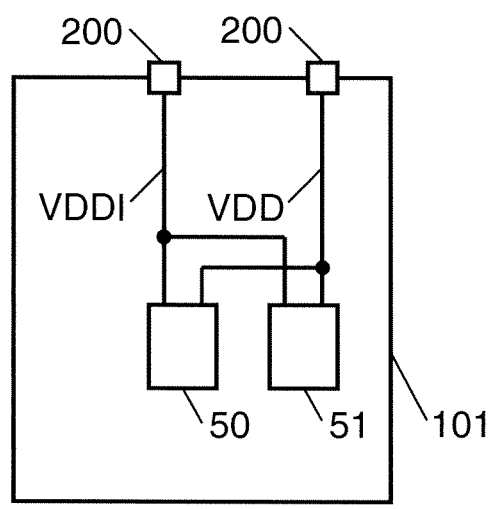
FIG. 16 is a circuit diagram showing a configuration of a semiconductor integrated circuit in a variation of the tenth exemplary embodiment of the present invention.

FIG. 16 is another configuration diagram of a semiconductor integrated circuit according to the tenth exemplary embodiment of the present invention.

Semiconductor integrated circuit 101 shown in FIG. 16 is provided with semiconductor memory devices 50 and 51, and external application terminal 200. Internal power supply VDDI and power supply VDD are supplied from external application terminals 200 to each of semiconductor memory devices 50 and 51.

In FIG. 15, the switching element (P-type MOS transistor MP50) is arranged in semiconductor integrated circuit 101, and power supplies to word line driver circuit 2 and bit line precharge circuit 3 in each of semiconductor memory devices 50 and 51 are cut off by controlling the switching element. Meanwhile, according to the configuration in FIG. 16, the switching element (P-type MOS transistor MP50) is excluded from the configuration in FIG. 15. Furthermore, it is controlled whether or not internal power supply VDDI (second power supply equivalent to the potential of power supply VDD) is supplied to word line driver circuit 2 and bit line precharge circuit 3 of each of semiconductor memory devices 50 and 51 from the outside of the semiconductor integrated circuit 101, through external application terminal 200.

Even when the switching element (P-type MOS transistor MP50) is not provided in semiconductor integrated circuit 101 like FIG. 15, it is apparent that the same action and effect as those of the configuration shown in FIG. 15 can be obtained by configuring such that whether or not internal power supply VDDI (second power supply) is supplied to word line driver circuit 2 and bit line precharge circuit 3 of each of semiconductor memory devices 50 and 51 can be controlled from the outside of semiconductor integrated circuit 101 like FIG. 16.

Eleventh Exemplary Embodiment

Next, a semiconductor memory device in an eleventh exemplary embodiment of the present invention will be described.

In general, a control signal (chip enable signal) for selecting whether or not the semiconductor memory device is in the standby state is inputted to the semiconductor memory device. For example, when the chip enable signal is at L level, the semiconductor memory device is in the normal acting state, and when the chip enable signal is at H level, the semiconductor memory device is in the standby state.

According to power supply cutoff signal PD described in the above, when the semiconductor memory device is in the standby state, power supply cutoff signal PD is switched to H level to cut off word line driver circuit 2 and bit line precharge circuit 3 of the semiconductor memory device from power supply VDD, and when the semiconductor memory device executes the normal action, power supply cutoff signal PD is switched to L level to supply power supply VDD to all the circuits.

That is, it can be easily understood that the chip enable signal inputted to the semiconductor memory device can be used in place of the control of power supply cutoff signal PD.

As described above, when the chip enable signal is used in the place of power supply cutoff signal PD, the control signal inputted to the semiconductor memory device can be reduced, and the control of the semiconductor memory device can be simplified.

It is apparent that the contents of this exemplary embodiment can be applied to all of the exemplary embodiments.

As described above, according to the semiconductor memory device in the present invention, only the specific circuit accounting for a majority of the leakage current in the standby state in the semiconductor memory device is cut off from the power supply, so that it is useful as the circuit capable of effectively preventing an area from being increased, effectively reducing the leakage current in the standby state, and lowering the power consumption in the semiconductor memory device and the semiconductor integrated circuit.

REFERENCE MARKS IN THE DRAWINGS 1, 1': memory cell
2: word line driver circuit
3, 3': bit line precharge circuit
4, 4', 4": input circuit
5: level shift circuit
6: substrate power supply region for memory cell
7: region for arranging power supply cutoff switching element
10: memory array
20: peripheral control circuit
30, 31, 40, 41, 50, 51: semiconductor memory device
100, 101: semiconductor integrated circuit
MP1, MP1B, MP50: P-type MOS transistor (switching element)
MN1: N-type MOS transistor (switching element)
MP2, MP3A to C, MP4, MP50: P-type MOS transistor
MN2, MN4: N-type MOS transistor
MN5: N-type MOS transistor (low impedance element)
A1, A2: access transistor
D1, D2: drive transistor
L1, L2: load transistor
R1: wiring resistance
NOR1: NOR circuit (input circuit)
NAND1: NAND circuit (input circuit)
WL, WL0, WLx: word line
BL, BL0, BLy, NBL, NBL0, NBLy: bit line
AD: address signal (first input signal)
PD: power supply cutoff signal (first control signal)
NWL: word line control signal
NPCG: bit line precharge control signal
VDDI: internal power supply
VDD: power supply (first power supply)
VDDB: substrate power supply of load transistor (first substrate power supply)
VSSB: substrate power supplies of access transistor and drive transistor (second substrate power supply)

What is claimed is:

1. A semiconductor memory device comprising:
   at least one memory cell connected to a word line and a bit line, for storing and holding data;
   at least one word line driver circuit connected to the word line;
   at least one bit line precharge circuit connected to the bit line; and
   a peripheral control circuit, wherein:
   a first power supply is connected to the memory cell and the peripheral control circuit, and
   the first power supply is connected to the word line driver circuit and the bit line precharge circuit through a switching element controlled by a first control signal,
   the switching element includes a MOS transistor, and
   the MOS transistor is turned on or off by the first control signal.

2. The semiconductor memory device according to claim 1, having at least one of
   (1) a channel length of the MOS transistor in the switching element is larger than a channel length of a MOS transistor in the word line driver circuit, and
   (2) a gate oxide film thickness of the MOS transistor in the switching element is larger than a gate oxide film thickness of the MOS transistor in the word line driver circuit.

3. The semiconductor memory device according to claim 1, wherein
   plural switching elements are distributed in at least two positions in the peripheral control circuit.

4. The semiconductor memory device according to claim 1, wherein
   plural switching elements are distributed in at least two positions in a periphery of the plurality of word line driver circuits.

5. The semiconductor memory device according to claim 1, wherein
   plural switching elements are distributed in at least two positions in a periphery of the plurality of bit line precharge circuits.

6. The semiconductor memory device according to claim 1, wherein
   the switching element is arranged adjacent to a substrate power supply region of the memory cell.

7. The semiconductor memory device according to claim 1, having:
   a first substrate power supply of a plurality of P-type MOS transistors in the memory cell; and
   a second substrate power supply of a plurality of N-type MOS transistors in the memory cell, and
   having at least one of (1) a voltage equal to or higher than source power supplies of the plurality of P-type MOS transistors in the memory cell is supplied to the first substrate power supply, and (2) a voltage equal to or lower than source power supplies of the plurality of N-type MOS transistors in the memory cell is supplied to the second substrate power supply.

8. The semiconductor memory device according to claim 1, wherein while the switching element is in an off state, the first power supply connected to the memory cell is controlled to be equal or lower than a voltage provided while the switching element is in an on state.

9. A semiconductor memory device comprising:

at least one memory cell connected to a word line and a bit line, for storing and holding data;

at least one word line driver circuit connected to the word line;

at least one bit line precharge circuit connected to the bit line; and a peripheral control circuit, wherein a first power supply is connected to the memory cell, the peripheral control circuit, and the bit line precharge circuit, the first power supply is connected to the word line driver circuit hrough a switching element controlled by a first control signal, and a control signal based on the first control signal is inputted to the bit line precharge circuit, so that the bit line precharge circuit s controlled to be turned off when the switching element is turned off.

10. The semiconductor memory device according to claim 9, wherein the switching element includes a MOS transistor, and the MOS transistor is turned on or off by the first control signal.

11. The semiconductor memory device according to claim 10, having at least one of (1) a channel length of the MOS transistor in the switching element is larger than a channel length of a MOS transistor in the word line driver circuit, and (2) a gate oxide film thickness of the MOS transistor in the switching element is larger than a gate oxide film thickness of the MOS transistor in the word line driver circuit.

12. The semiconductor memory device according to claim 9, wherein plural switching elements are distributed in at least two positions in the peripheral control circuit.

13. The semiconductor memory device according to claim 2, wherein plural switching elements are distributed in at least two positions in a periphery of the plurality of word line driver circuits.

14. The semiconductor memory device according to claim 9, wherein plural switching elements are distributed in at least two positions in a periphery of the plurality of bit line precharge circuits.

15. The semiconductor memory device according to claim 9, wherein the switching element is arranged adjacent to a substrate power supply region of the memory cell.

16. The semiconductor memory device according to claim 9, having:

a first substrate power supply of a plurality of P-type MOS transistors in the memory cell; and a second substrate power supply of a plurality of N-type MOS transistors in the memory cell, and having at least one of (1) a voltage equal to or higher than source power supplies of the plurality of P-type MOS transistors in the memory cell is supplied to the first substrate power supply, and (2) a voltage equal to or lower than source power supplies of the plurality of N-type MOS transistors in the memory cell is supplied to the second substrate power supply.

17. The semiconductor memory device according to claim 9, wherein while the switching element is in an off state, the first power supply connected to the memory cell is controlled to be equal or lower than a voltage provided while the switching element is in an on state.

18. A semiconductor memory device comprising:

at least one memory cell connected to a word line and a bit line, for storing and holding data;

at least one word line driver circuit connected to the word line;

at least one bit line precharge circuit connected to the bit line; and a peripheral control circuit, wherein:

a first power supply is connected to the memory cell and the peripheral control circuit, and the first power supply is connected to the word line driver circuit and the bit line precharge circuit through switching elements controlled by a first control signal, and the switching elements are distributed in (i) at least two positions in the peripheral control circuit, (ii) in at least two positions in a periphery of the plurality of word line driver circuits, or (iii) in at least two positions in a periphery of the plurality of bit line precharge circuits.

* * * * *